United States Patent
Basavalingappa et al.

(10) Patent No.: US 10,541,141 B2
(45) Date of Patent: *Jan. 21, 2020

(54) METHOD FOR SELECTIVELY ETCHING WITH REDUCED ASPECT RATIO DEPENDENCE

(71) Applicant: Lam Research Corporation, Fremont, CA (US)

(72) Inventors: Adarsh Basavalingappa, Albany, NY (US); Peng Wang, Clifton Park, NY (US); Bhaskar Nagabhirava, Cohoes, NY (US); Michael Goss, Holliston, MA (US); Prabhakara Gopaladasu, Fremont, CA (US); Randolph Knarr, Voorheesville, NY (US); Stefan Schmitz, Malta, NY (US); Phil Friddle, Clifton Park, NY (US)

(73) Assignee: Lam Research Corporation, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/045,330

(22) Filed: Jul. 25, 2018

(65) Prior Publication Data

US 2018/0330959 A1 Nov. 15, 2018

Related U.S. Application Data

(63) Continuation of application No. 15/290,800, filed on Oct. 11, 2016, now Pat. No. 10,037,890.

(51) Int. Cl.
*H01L 21/306* (2006.01)
*H01L 21/3065* (2006.01)
(Continued)

(52) U.S. Cl.
CPC ...... *H01L 21/3065* (2013.01); *H01L 21/0217* (2013.01); *H01L 21/02164* (2013.01);
(Continued)

(58) Field of Classification Search
CPC ........... H01L 21/3065; H01L 21/02164; H01L 21/0217; H01L 21/02274; H01L 21/3081; H01L 21/6833; H01L 29/161
See application file for complete search history.

(56) References Cited

U.S. PATENT DOCUMENTS

| 6,235,214 B1 | 5/2001 | Deshmukh et al. |
| 10,037,890 B2 * | 7/2018 | Basavalingappa ......................... H01L 21/02164 |

(Continued)

FOREIGN PATENT DOCUMENTS

| JP | 2002-025979 | 1/2002 |
| JP | 2016-16616 | 7/2016 |

OTHER PUBLICATIONS

International Search Reporting from International Application No. PCT/US2017/053784 dated Jan. 11, 2018.

(Continued)

*Primary Examiner* — Duy Vu N Deo
(74) *Attorney, Agent, or Firm* — Beyer Law Group LLP (57) ABSTRACT

A method for selectively etching an etch layer with respect to a mask is provided. An etch process is provided comprising a plurality of etch cycles, wherein each etch cycle comprises providing a deposition phase and an etch phase. The deposition phase comprises providing a flow of a deposition phase gas, comprising a fluorocarbon or hydrofluorocarbon containing gas and an oxygen containing gas with a fluorocarbon or hydrofluorocarbon to oxygen ratio, providing a RF power, which forms the deposition phase gas into a plasma, and stopping the deposition phase. The etch
(Continued)

phase, comprises providing a flow of an etch phase gas, comprising a fluorocarbon or hydrofluorocarbon containing gas and an oxygen containing gas with a fluorocarbon or hydrofluorocarbon to oxygen ratio that is lower than the fluorocarbon or hydrofluorocarbon to oxygen ratio of the deposition phase gas, providing a RF power, and stopping the etch phase.

20 Claims, 6 Drawing Sheets

(51) Int. Cl.
    *H01L 21/02*     (2006.01)
    *H01L 21/308*     (2006.01)
    *H01L 21/683*     (2006.01)
    *H01L 29/161*     (2006.01)

(52) U.S. Cl.
    CPC .... *H01L 21/02274* (2013.01); *H01L 21/3081* (2013.01); *H01L 21/6833* (2013.01); *H01L 29/161* (2013.01)

(56) References Cited

U.S. PATENT DOCUMENTS

| | | |
|---|---|---|
| 2007/0249182 A1 | 10/2007 | Mani et al. |
| 2008/0057724 A1 | 3/2008 | Kiehlbauch et al. |
| 2008/0081477 A1 | 4/2008 | Ikeda |
| 2014/0051256 A1 | 2/2014 | Zhong et al. |
| 2014/0197499 A1 | 7/2014 | Chen et al. |
| 2015/0255569 A1 | 9/2015 | Kim et al. |
| 2015/0270264 A1 | 9/2015 | Basker et al. |
| 2016/0064247 A1 | 3/2016 | Tomura et al. |
| 2016/0093506 A1 | 3/2016 | Chen et al. |
| 2016/0126068 A1 | 5/2016 | Lee et al. |
| 2018/0102253 A1 | 4/2018 | Basavalingappa et al. |

OTHER PUBLICATIONS

Written Opinion from International Application No. PCT/US2017/053784 dated Jan. 11, 2018.
Office Action from U.S. Appl. No. 15/290,800 dated Sep. 28, 2017.
Notice of Allowance from U.S. Appl. No. 15/290,800 dated Mar. 29, 2018.

\* cited by examiner

METHOD FOR SELECTIVELY ETCHING WITH REDUCED ASPECT RATIO DEPENDENCE

CROSS REFERENCE TO RELATED APPLICATION

This application is a continuation of U.S. application Ser. No. 15/290,800 filed on Oct. 11, 2016, issued on Jul. 31, 2018 as patent Ser. No. 10/037,890, the entire contents of which are incorporated herein by reference thereto.

BACKGROUND

The disclosure relates to a method of forming semiconductor devices on a semiconductor wafer. More specifically, the disclosure relates to a fin reveal process in the formation of semiconductor devices.

In forming semiconductor devices, thin fins may be formed. A layer may be etched to reveal fins.

SUMMARY

To achieve the foregoing and in accordance with the purpose of the present disclosure, a method for selectively etching an etch layer with respect to a mask with isolated and dense regions is provided. The etch layer is placed in a processing chamber. An etch process is provided comprising a plurality of etch cycles, wherein each etch cycle comprises providing a deposition phase and an etch phase. The deposition phase comprises providing a flow of a deposition phase gas into the processing chamber comprising a fluorocarbon or hydrofluorocarbon containing gas and an oxygen containing gas with a fluorocarbon or hydrofluorocarbon to oxygen ratio, providing a RF power, which forms the deposition phase gas into a plasma, and stopping the deposition phase, by stopping the flow of the deposition phase gas into the processing chamber. The etch phase, comprises providing a flow of an etch phase gas into the processing chamber comprising a fluorocarbon or hydrofluorocarbon containing gas and an oxygen containing gas with a fluorocarbon or hydrofluorocarbon to oxygen ratio that is lower than the fluorocarbon or hydrofluorocarbon to oxygen ratio of the deposition phase gas, providing a RF power, which forms the etch phase gas into a plasma, and stopping the etch phase, by stopping the flow of the etch phase gas into the processing chamber.

In another manifestation, a method for selectively etching a silicon oxide containing layer with respect to a silicon nitride containing mask with isolated and dense regions is provided. The etch layer is placed in a processing chamber. An electrostatic chuck temperature is maintained between 60° C. to 120° C. An etch process is provided comprising a plurality of etch cycles, wherein each etch cycle comprises a deposition phase and an etch phase. The deposition phase comprises providing a flow of a deposition phase gas into the processing chamber comprising a fluorocarbon or hydrofluorocarbon containing gas, providing a RF power, which forms the deposition phase gas into a plasma, and stopping the deposition phase. The etch phase comprises providing a flow of an etch phase gas, which is fluorocarbon and hydrofluorocarbon free and comprises Ar and an oxygen containing gas, into the processing chamber, providing a RF power, which forms the etch phase gas into a plasma, and stopping the etch phase.

These and other features of the present invention will be described in more details below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
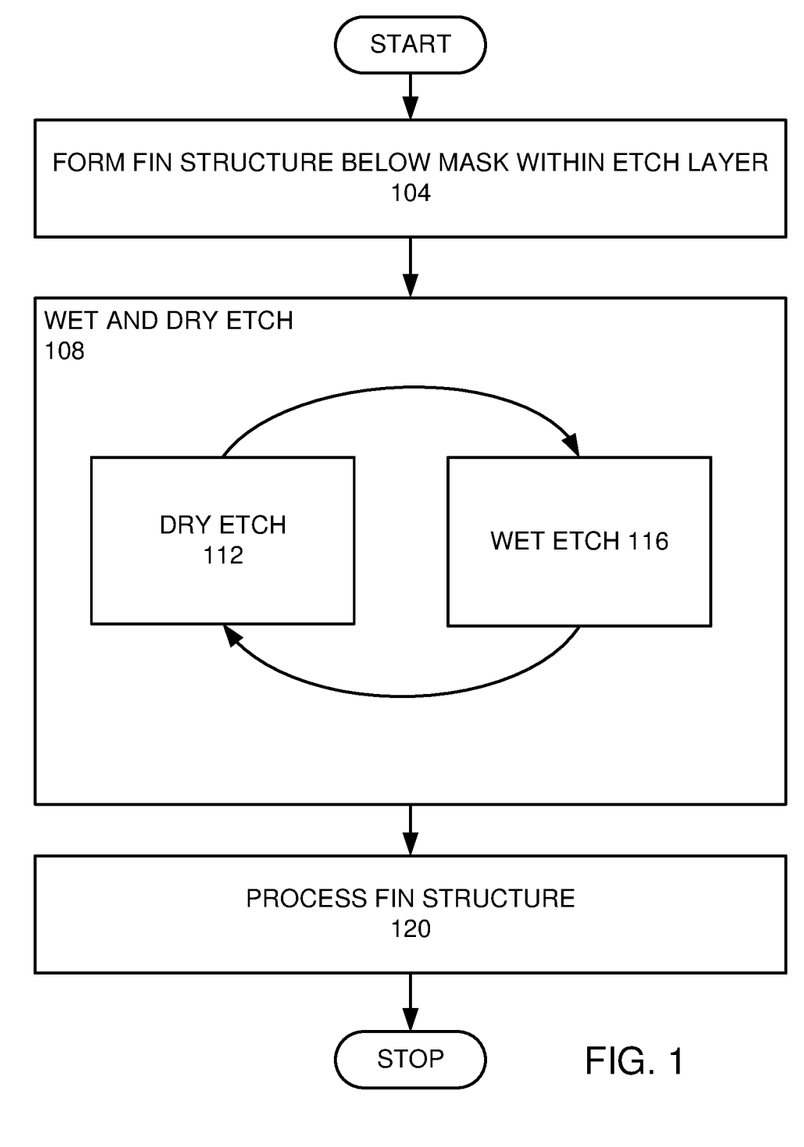
FIG. 1 is a high level flow chart of an embodiment.
Figure 2:
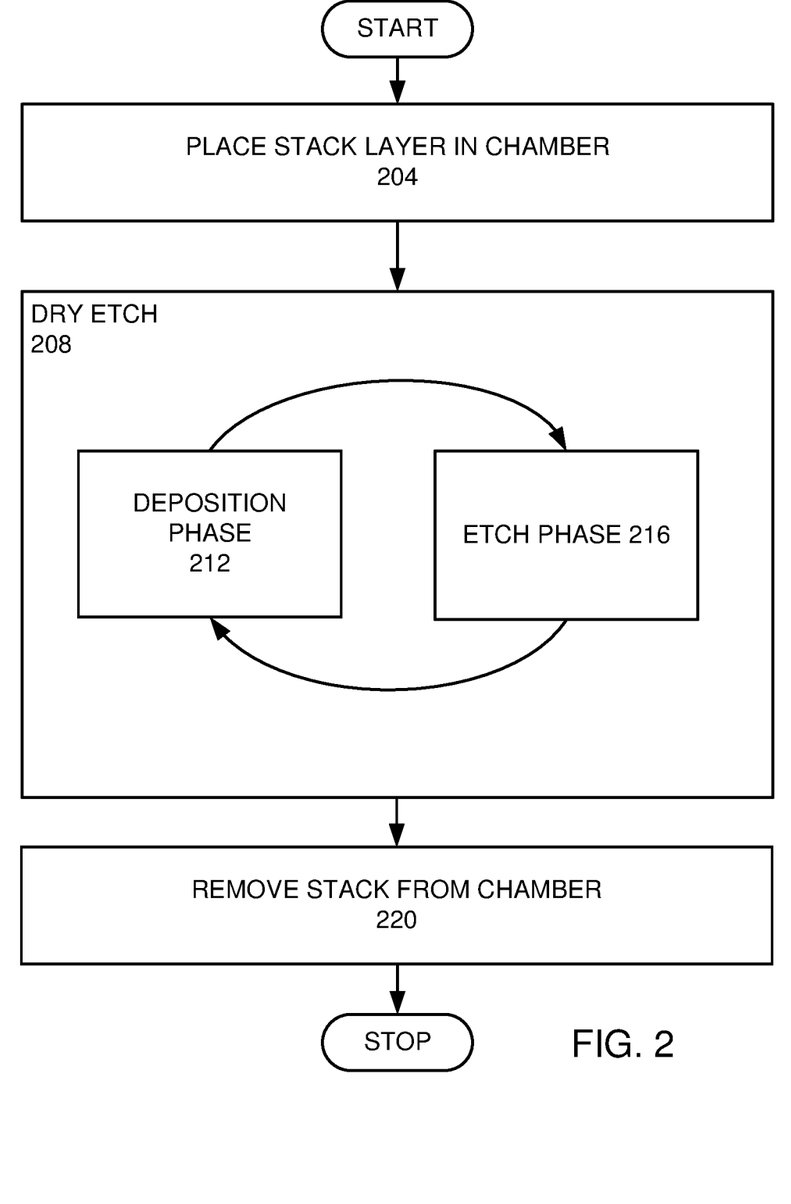
FIG. 2 is a more detailed flow chart of the step of etching trenches.

FIG. 1 is a high level flow chart of an embodiment. In this embodiment, a fin structure is formed below a mask in an etch layer (step 104). A cyclical wet and dry etch process is provided (step 108). Each cycle of the wet and dry etch process comprises a dry etch process (step 112) and a wet etch process (step 116). The fin structure may be further processed. FIG. 2 is a more detailed flow chart of the step of providing a dry etch process (step 112). The etch layer is placed in a plasma processing chamber (step 204). A cyclical dry etch process is provided (step 208). Each cycle of the cyclical dry etch process comprises a deposition phase (step 212) and an etch phase (step 216). The etch layer is removed from the plasma processing chamber (step 220).

Example

Figure 3A:
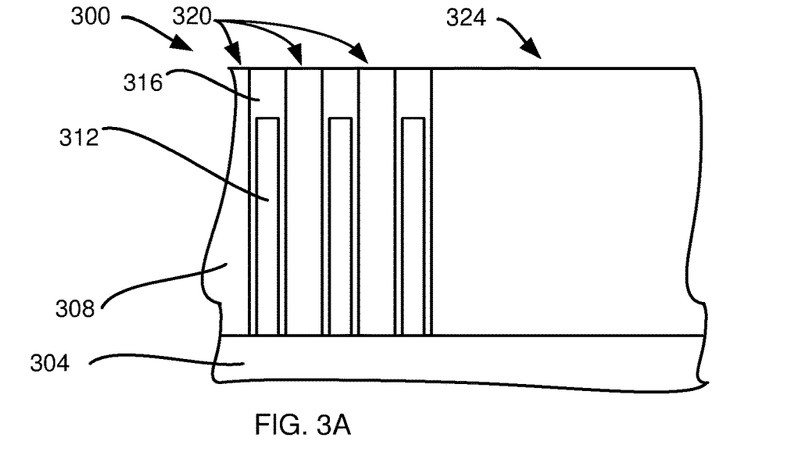
FIGS. 3A-E are schematic cross-sectional views of a stack processed according to an embodiment.

In a preferred embodiment of the invention, a fin structure is formed below a mask in an etch layer (step 104). FIG. 3A is a schematic cross-sectional view of a stack 300 with a substrate 304 with a silicon oxide etch layer 308. Fin structures 312 are formed in the etch layer 308. In this example, the fin structures 312 are made of SiGe. A hardmask 316 surrounds the fin structures 312. In this example, the hardmask 316 is made of silicon nitride (SiN). In this example, one or more layers may be disposed between the different layers. For example, a silicon oxide liner may be placed between the fin structures 312 and the hardmask 316. The silicon oxide etch layer 308 has dense regions 320 and isolated regions 324. When etched, the dense regions 320 of the silicon oxide etch layer 308 will have a higher depth to width ratio than the isolated regions 324, which could cause uneven etching. In addition, in the formation of the silicon oxide etch layer 308, different silicon oxide materials may be used in the dense regions 320 compared to the isolated regions 324. For example, the isolated region may be formed from a regular spin on silicon oxide material. Whereas, the dense region may use a silicon oxide based eHARP oxide that is specifically formulated for high aspect ratio fill processes. The differences in the silicon oxide etch layer materials may further differentiate etch rates between the dense regions 320 and isolated regions 324.

A cyclical wet and dry etch process is provided (step 108). Each cycle of the wet and dry etch process comprises a dry etch process (step 112) and a wet etch process (step 116). FIG. 2 is a more detailed flow chart of the step of providing a dry etch process (step 112). The stack is placed in a plasma processing chamber (step 204).

Figure 4:
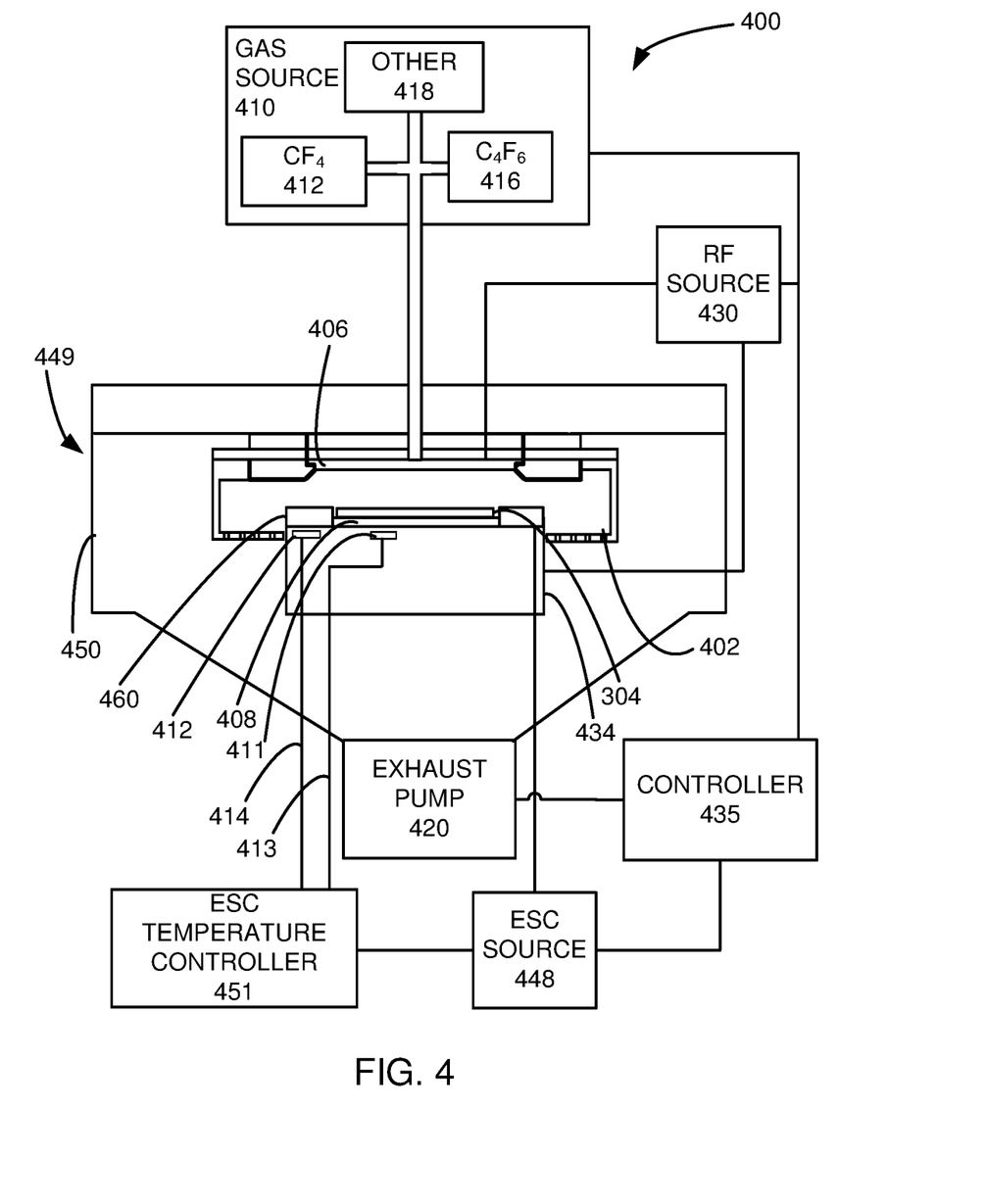
FIG. 4 is a schematic view of a plasma processing chamber that may be used in an embodiment.

FIG. 4 is a schematic view of a plasma processing chamber that may be used in an embodiment. In one or more embodiments, the plasma processing system 400 comprises a gas distribution plate 406 providing a gas inlet and an electrostatic chuck (ESC) 408, within a processing chamber 449, enclosed by a chamber wall 450. Within the processing chamber 449, a substrate 304 is positioned on top of the ESC 408. An edge ring 460 is placed around the substrate 304. The ESC 408 may provide a bias from the ESC source 448. A gas source 410 is connected to the plasma processing chamber 449 through the distribution plate 406. In this embodiment, the gas source 410 comprises a $CF_4$ gas source 412, a $C_4F_6$ gas source 416, and one or more additional gas sources 418. Each gas source may comprise multiple gas sources. An ESC temperature controller 451 is connected to the ESC 408, and provides temperature control of the ESC 408. The ESC temperature controller 451 or another temperature controller may also be used to control the temperature of the edge ring 460. In this example, a first connection 413 for providing power to an inner heater 411 for heating an inner zone of the ESC 408 and a second connection 414 for providing to an outer heater 412 for heating an outer zone of the ESC 408. An RF source 430 provides RF power to a lower electrode 434 and an upper electrode, which in this embodiment is the gas distribution plate 406. In a preferred embodiment, 2 MHz, 60 MHz, and optionally, 27 MHz power sources make up the RF source 430 and the ESC source 448. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments, such as in another embodiment the upper electrodes may be grounded A controller 435 is controllably connected to the RF source 430, the ESC source 448, an exhaust pump 420, and the etch gas source 410. An example of such a plasma processing chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 5:
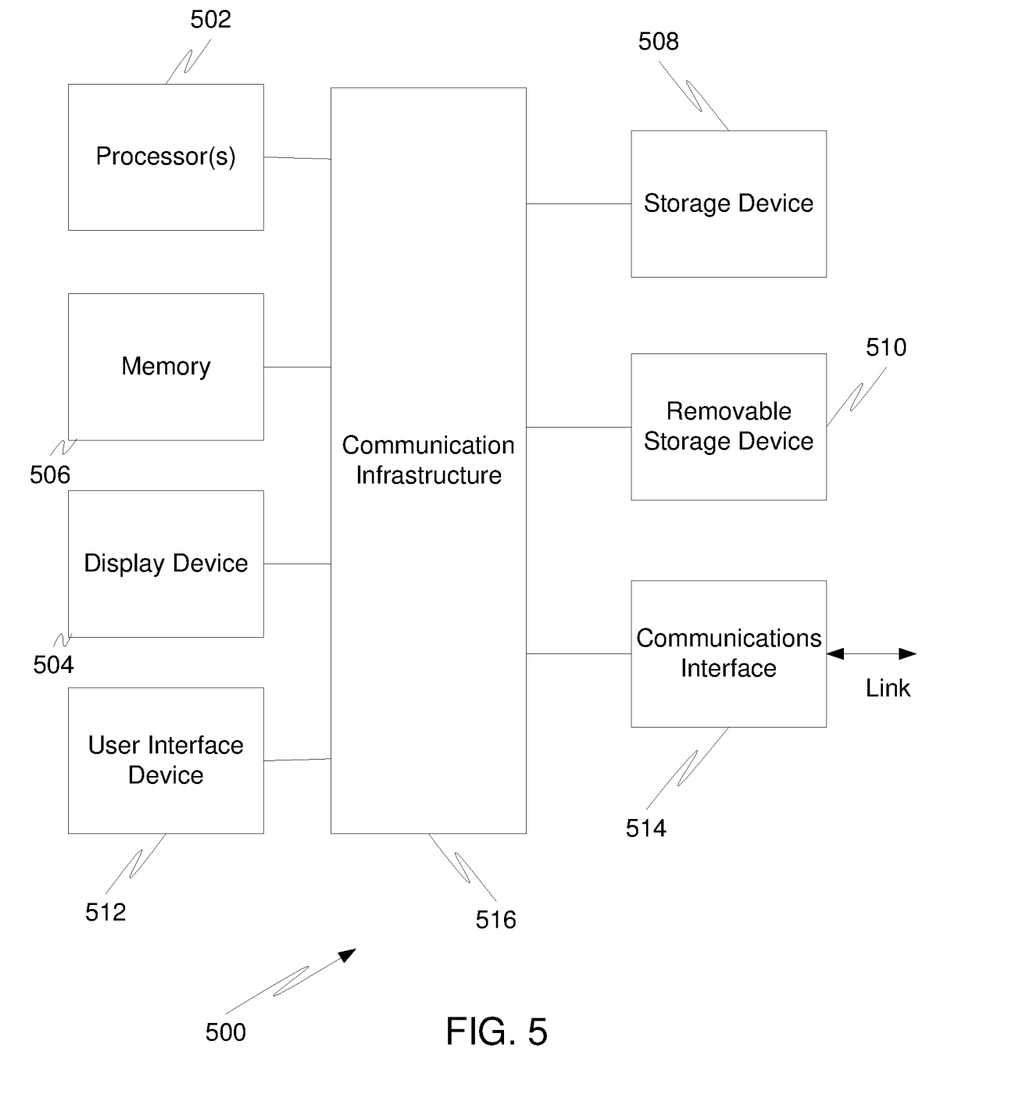
FIG. 5 is a schematic view of a computer system that may be used in practicing an embodiment.

FIG. 5 is a high level block diagram showing a computer system 500, which is suitable for implementing a controller 435 used in embodiments of the present invention. The computer system may have many physical forms ranging from an integrated circuit, a printed circuit board, and a small handheld device, up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

After the stack 300 has been placed into the plasma processing chamber 449, a dry etch process may be provided (step 112). The dry etch process comprises a plurality of cycles, where each cycle comprises a deposition phase (step 212) and an etch phase (step 216). An example of a deposition phase provides a deposition phase gas comprising a fluorocarbon or hydrofluorocarbon containing gas with a fluorine to carbon ratio. In this example, a deposition phase gas of 2 sccm $C_4F_6$ and 341 sccm Ar is flowed into the plasma processing chamber 449, while a pressure of 15 mTorr is maintained. The deposition phase gas is formed into an in situ plasma. In this example, the deposition phase gas is formed into a plasma by providing a pulsed RF power with an RF frequency of at least 60 MHz. In this example, 100 Watts of RF power are provided with a 10% duty cycle. After 4 seconds, the deposition phase (step 212) is stopped. In this example, the deposition phase (step 212) is stopped by stopping the flow of deposition phase gas.

An example of an etch phase provides an etch phase gas comprising a gas with a fluorine to carbon ratio that is higher than the fluorine to carbon ratio of the deposition phase gas. In this example, a recipe for an etch phase gas is 343 sccm Ar. The chamber pressure is maintained at 15 mTorr. The etch phase gas is formed into an in situ plasma. In this example, the etch phase gas is formed into a plasma by providing a pulsed RF power with an RF frequency of at least 60 MHz. In this example, 100 Watts of RF power are provided with a 40% duty cycle. A bias is provided to increase the bombardment of the etch layer. In this example, the bias is provided by providing 100 Watts of 2 MHz RF power. After 3 seconds, the etch phase (step 216) is stopped. In this example, the etch phase (step 216) is stopped by stopping the flow of etch phase gas. After a plurality of cycles, the etch process is stopped. In this example, the process is provided for 7 cycles. The silicon oxide etch layer is removed from the plasma processing chamber 449 (step 220).

Figure 3B:
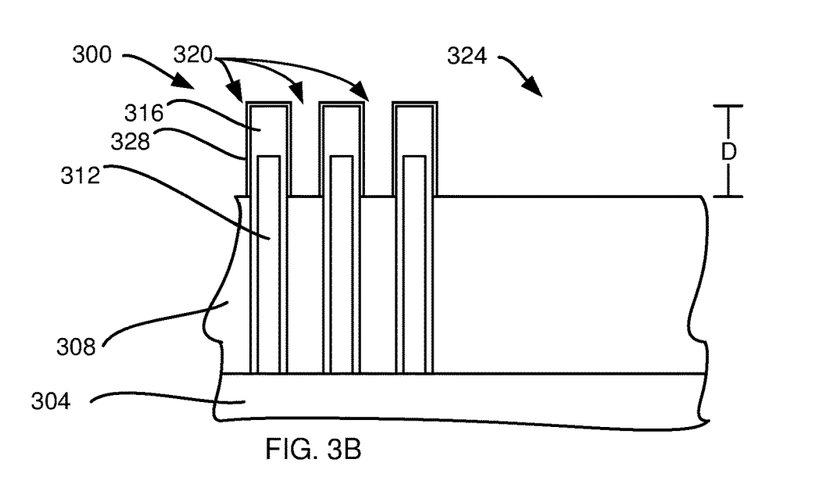

FIG. 3B is a schematic cross-sectional view of the stack 300 after the stack 300 has been removed from the plasma processing chamber 449. The silicon oxide etch layer 308 has been etched back to the same depth "D: in both the dense regions 320 and isolated regions 324. A residue 328 may be deposited during the dry etching process. In this example, a silicon oxide containing residue is deposited.

Figure 3C:
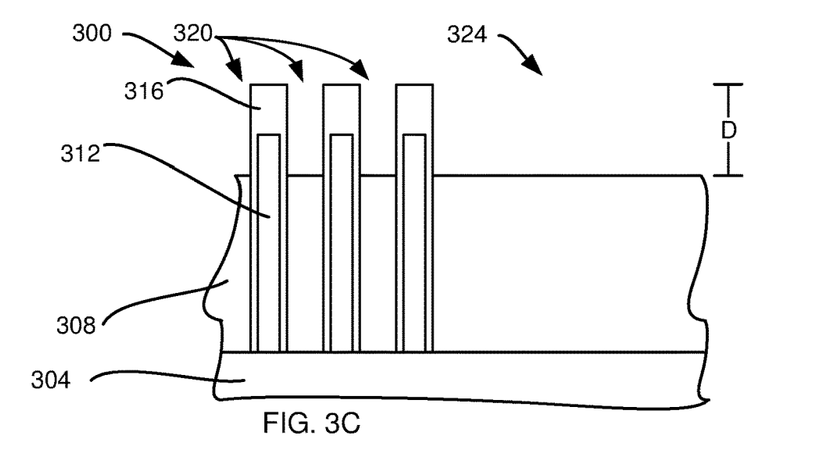

A wet etch process is provided (step 116). In this example the wet process a bath of diluted HF, with a mole ratio of water to HF of at least 300:1. The stack is exposed to the bath for between 5 and 60 seconds. FIG. 3C is a schematic cross-sectional view of the stack 300 after the residue has been removed by the wet etch.

Figure 3D:
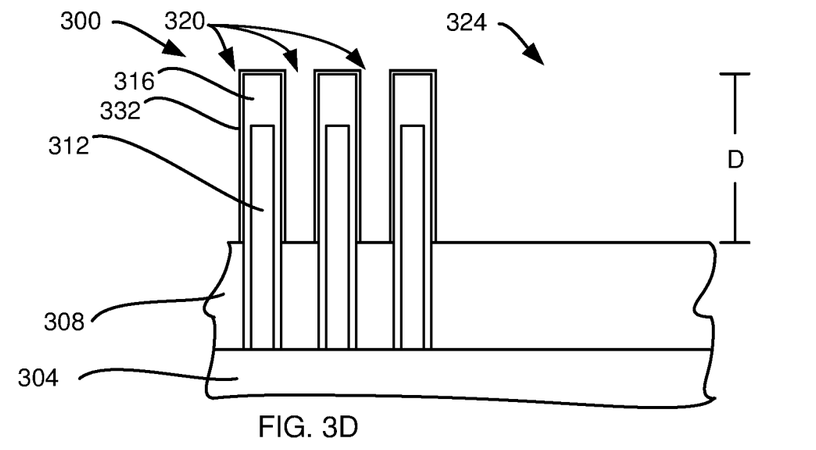

The stack 300 is subjected to a second dry etch process (step 112). In this example, this second dry etch process uses the same recipe as the first dry etch process. In other embodiments, the second dry etch process may be changed from the first dry etch process to better etch the higher aspect ratio features. FIG. 3D is a schematic cross-sectional view of the stack 300 after the second dry etch process is completed. Residue 332 has been deposited by the second dry etch process.

Figure 3E:
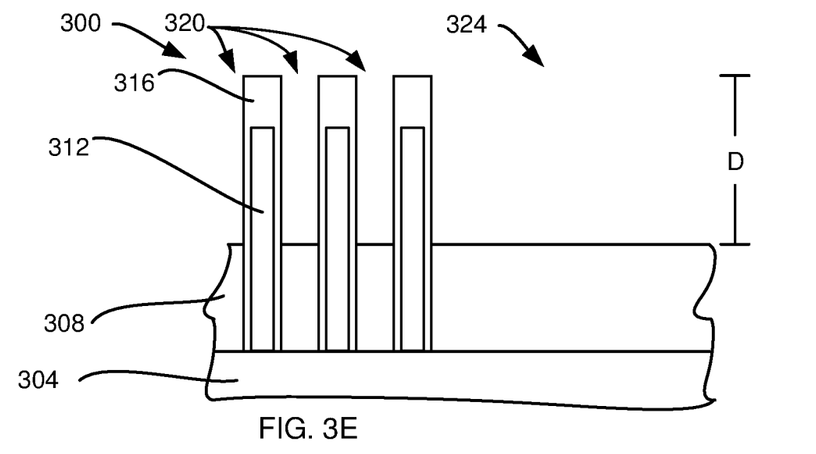

A second wet etch process is provided (step 116). In this example, the second wet etch process uses the same recipe as the first wet etch process. In other embodiments, the recipe may be tuned to differ from the first wet etch process in order to better remove deposits from higher aspect ratio features. FIG. 3E is a schematic cross-sectional view of the stack 300 after the residue has been removed by the second wet etch.

Without being bound by theory, a combination of wet and dry etches provides an improved etch over either dry etches alone or wet etches alone. Wet etches are isotropic. Dry etches are anisotropic. Using only wet etches causes only isotropic etching, which may cause undercutting. In addition, wet etching can have difficulty in etching smaller dimensions depending on wetting capability and or phobicity of material to be etched and chemicals being used to etch the material. In addition, such etch processes have nonuniform etch depths when etching more than one type of material. Such etches also may have poor etch selectivity. Such etches may also cause corner loss. In addition, achieving etch uniformity across an entire wafer surface is difficult.

By using a process that has both a dry etch and wet etch, where additional tuning controls are provided by the different etches, various embodiments are able to simultaneously etch dense and isolated regions with reduced lag. In addition, embodiments are able to etch different types of silicon oxide containing layers at the same rate so that a uniform depth is etched in the different silicon oxide containing layers, without the use of an etch stop layer. The dense regions require high aspect ratio etching with high depth to width ratio. Various embodiments are able to etch high aspect ratio features, with a depth to width ratio greater than 2:1. More preferably, the depth to width aspect ratio is greater than 5:1 with a CD of less than 20 nm. More preferably, the CD is less than 15 nm. Various embodiments reduce corner loss. Various embodiments have a high etch selectivity, and may be tuned to uniformly, simultaneously etch more than one material. Various embodiments provide a vertical profile without undercutting and minimal seams, voids, and bridging of patterns. Various embodiments are able to provide uniform etching across a wafer surface. By providing a dry etch and wet etch combination, various embodiments are able to simultaneously provide the above benefits.

Various embodiments provide a dry etch a deposition phase and an etch phase. An etch gas used during the etching phase is leaner than the deposition gas used during the deposition phase. In some embodiments, a leaner gas has a lower carbon to fluorine ratio.

In the above example, polymer is deposited on the silicon nitride mask and the silicon oxide containing etch layer. However, the release of oxygen from etching the silicon oxide containing layer causes the polymer to be removed. The absence of oxygen in the silicon nitride mask prevents the polymer from being removed. This selective removal of polymer from the silicon oxide containing etch layer causes the silicon oxide containing etch layer to be more selectively etched with respect to the mask.

In some embodiments, the etch gas comprises $C_4F_6$, $O_2$, and Ar. Ar is primarily used to maintain chamber pressure. $C_4F_6$ and $O_2$ are used for etching. In some embodiments, Ar may be substituted by CO.

In another example, the deposition phase gas may be 2 sccm $C_4F_6$, 2 sccm $O_2$, 323 sccm Ar, and 20 sccm CO. A 60 MHz RF signal provides 100 Watts of power and is pulsed with a 10% duty cycle. A 2 MHz RF signal provides 50-100 Watts and is pulsed with a frequency of 100 Hz and a 10% duty cycle. The chamber pressure is maintained at 15 mTorr. The deposition phase is maintained for 5 seconds. The etch phase gas may be 4 sccm $C_4F_6$, 2.5 sccm $O_2$, 323 sccm Ar, and 20 sccm CO. A 60 MHz RF signal provides 100 Watts of power and is pulsed with a 10% duty cycle. A 2 MHz RF signal provides 50-100 Watts and is pulsed with a frequency of 100 Hz and a 10% duty cycle. The chamber pressure is maintained at 15 mTorr. The etch phase is maintained for 3 seconds. This example is repeated for 5 cycles. In this example, the deposition phase gas comprises a fluorocarbon or hydrofluorocarbon containing gas. The etch phase gas is fluorocarbon and hydrofluorocarbon free and instead comprises Ar and an oxygen containing gas. The oxygen containing gas may be $O_2$, $CO_2$, or CO. The ESC 408 is maintained at a temperature of between 60° C. and 120° C. More preferably, the edge ring 460 is also maintained at a temperature of between 60° C. and 120° C. The ESC temperature controller 151 and/or another temperature controller may be used to accomplish this. The preferred temperature range has been found to control polymer deposition to provide the desired selectivity, while avoiding pinch off. Preferably, more bias is provided during the etch phase than during the deposition phase. More RF power may be provided during the etch phase than the deposition phase. Such an embodiment is able to uniformly etch both isolated and dense regions without lag. Such regions may be uniformly and partially etched without an etch stop. A subsequent wet etch may be used to complete processing of the stack.

Fin structure here in the specification and claims refers to structure which is in the form of a fin. For example, the structure comprising 312 and 316 can represent a fin structure. In an embodiment the fin structure may comprise SiGe fin, oxide liner surrounding 312, and nitride liner and hard mask (316) surrounding the oxide liner and fin. In other embodiments, the fin structure may be basically any material, which can be used to make devices, such as Ge or III-V materials.

In another embodiment the fin structure may comprise replacement contact material, spacer material adjacent to the replacement contact material, and Silicon based nitride cap material (hard mask) on top of the replacement contact material.

In another embodiment of this invention, the proposed methodology can be used to make replacement contact etch to reveal active area of the device (metal contacts to semiconductor device) by removing the contact replacement material. The contact replacement material here is typically silicon based oxide. This may be followed by contact metal deposition, planarization, inter level dielectric (ILD) deposition and further processing steps.

Other embodiments may provide other RF frequencies. Preferably, a bias frequency is less than 10 MHz. Preferably, the etch phase has a bias RF power with a RF frequency of less than 10 MHz that is greater in power than the bias RF power with a RF frequency of less than 10 MHz provided during the deposition phase.

Other embodiments may use a dry stripping such as an $O_2$ based strip or $N_2/H_2$ strip to remove deposits. Other embodiments may have more than one deposition phase or etch phase for each cycle.

In various embodiments, the etching to an even depth between isolated and dense regions means etching to a depth with no more than 10 nm difference between the etch depths. Therefore, the lag between the etch depths of the isolated versus the dense regions is no more than 10 nm.

In some embodiments, the wet etch uses an HF or HCl etch chemistry or a combination thereof. In some embodiments, the wet etch may be used to reduce or eliminate an oxide foot. Such wet etching may be used to provide a straighter profile, when following a dry etch process.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for selectively etching an etch layer with respect to a mask with isolated and dense regions in a processing chamber, comprising:
    providing an etch process comprising a plurality of etch cycles, wherein each etch cycle comprises:
        providing a deposition phase, comprising:
            providing a flow of a deposition phase gas into the processing chamber comprising a fluorocarbon or hydrofluorocarbon containing gas and an oxygen containing gas with a fluorocarbon or hydrofluorocarbon to oxygen ratio;
            providing a RF power, wherein the RF power transforms the deposition phase gas into a plasma; and
            stopping the deposition phase; and
        providing an etch phase, comprising:
            providing a flow of an etch phase gas into the processing chamber comprising a fluorocarbon or hydrofluorocarbon containing gas and an oxygen containing gas with a fluorocarbon or hydrofluorocarbon to oxygen ratio that is different than the fluorocarbon or hydrofluorocarbon to oxygen ratio of the deposition phase gas;
            providing a RF power, wherein the RF power transforms the etch phase gas into a plasma; and
            stopping the etch phase.

2. The method, as recited in claim 1, wherein a bias is provided during the etch phase, wherein the bias provided during the etch phase is higher than a bias provided during the deposition phase.

3. The method, as recited in claim 1, wherein the etch phase gas comprises at least one of $CF_4$, $C_4F_6$, $O_2$, or Ar and wherein the deposition phase gas comprises at least $C_4F_6$ and an oxygen containing gas.

4. The method, as recited in claim 1, wherein the etch layer comprises silicon oxide.

5. The method, as recited in claim 4, wherein the mask is a silicon containing mask.

6. The method, as recited in claim 1, wherein the etch partially etches the etch layer to a target depth.

7. The method, as recited in claim 1, wherein the etch process selectively deposits polymer on the mask with respect to the etch layer.

8. The method, as recited in claim 1, wherein the etch phase further comprises providing a bias RF power with an RF frequency of less than 10 MHz, wherein the deposition phase does not have a bias RF power with an RF frequency of less than 10 MHz.

9. The method, as recited in claim 1, further comprising providing a wet process to remove residue formed by the etch process.

10. The method, as recited in claim 1, further comprising providing a wet process to remove taper formed by the etch process.

11. The method, as recited in claim 1, wherein the RF power provided during the etch phase is greater than the RF power provided during the deposition phase.

12. A method for selectively etching a silicon oxide containing layer with respect to a mask with isolated and dense regions in a processing chamber, comprising:
    providing an etch process comprising a plurality of etch cycles, wherein each etch cycle comprises:
        providing a deposition phase, comprising:
            providing a flow of a deposition phase gas into the processing chamber comprising a fluorocarbon or hydrofluorocarbon containing gas;
            providing a RF power, wherein the RF power transforms the deposition phase gas into a plasma; and
            stopping the deposition phase; and
        providing an etch phase, comprising:
            providing a flow of an etch phase gas, which is fluorocarbon and hydrofluorcarbon free and comprises an oxygen containing gas, into the processing chamber;
            providing a RF power, wherein the RF power transforms the etch phase gas into a plasma; and
            stopping the etch phase.

13. The method, as recited in claim 12, wherein a bias is provided during the etch phase, wherein the bias provided during the etch phase is higher than a bias provided during the deposition phase.

14. The method, as recited in claim 12, wherein the etch partially etches the etch layer to a target depth.

15. The method, as recited in claim 12, wherein the etch phase further comprises providing a bias RF power of less than 10 MHz, wherein the deposition phase does not have a bias RF power of less than 10 MHz.

16. The method, as recited in claim 12, further comprising providing a wet process to remove residue formed by the etch process.

17. The method, as recited in claim 12, wherein the RF power provided during the etch phase is greater than the RF power provided during the deposition phase.

18. The method, as recited in claim 12, wherein the mask is a hardmask.

19. The method, as recited in claim 12, wherein the mask is a silicon containing mask.

20. The method, as recited in claim 12, further comprising maintaining an electrostatic chuck at a temperature between 60° C. to 120° C.

\* \* \* \* \*